United States Patent [19]

Petri

[11] Patent Number: 4,969,065
[45] Date of Patent: Nov. 6, 1990

[54] SPACER FOR CIRCUIT BOARDS AND CIRCUIT BOARD ASSEMBLY INCLUDING SAME

[76] Inventor: Hector D. Petri, 384 Edmunds Rd., Framingham, Mass. 01701

[21] Appl. No.: 316,829

[22] Filed: Feb. 28, 1989

[51] Int. Cl.⁵ .......................... H05K 7/12; F16B 5/06; F16B 13/06
[52] U.S. Cl. ............................. 361/412; 174/138 D; 411/57
[58] Field of Search .................... 174/138 D; 361/403, 361/412, 417, 418, 419, 420; 24/297, 453, 458; 411/508, 15, 44, 49, 55, 57, 60; 439/74

[56] References Cited

U.S. PATENT DOCUMENTS

| | | | |
|---|---|---|---|
| 2,936,015 | 5/1960 | Rapata | 174/138 D X |
| 3,513,509 | 5/1970 | Gross | 174/138 D X |
| 3,836,704 | 9/1974 | Coules | 361/412 X |
| 3,854,374 | 12/1974 | Boyle et al. | 174/138 D X |
| 4,726,722 | 2/1988 | Wollar | 411/508 X |

FOREIGN PATENT DOCUMENTS 1061664 3/1967 United Kingdom ........... 174/138 D

Primary Examiner—Laramie E. Askin
Attorney, Agent, or Firm—John E. Toupal; Harold G. Jarcho

[57] ABSTRACT

A circuit board assembly including a first board; a second board substantially parallel to and separated from the first board; a spacer comprising a body portion disposed between the boards and having a shoulder portion engaging on one side of the first board a surface area directly adjacent to an opening through the first board, a stem portion extending through the opening, and a latch portion engaging another side of the first board opposite to the one side thereof; an actuator retaining the latch portion in a position providing the engagement with another side of the first board; and a fastener engaging opposite sides of the second board and thereby preventing any substantial movement thereof relative to the first board.

6 Claims, 1 Drawing Sheet

U.S. Patent    Nov. 6, 1990    4,969,065
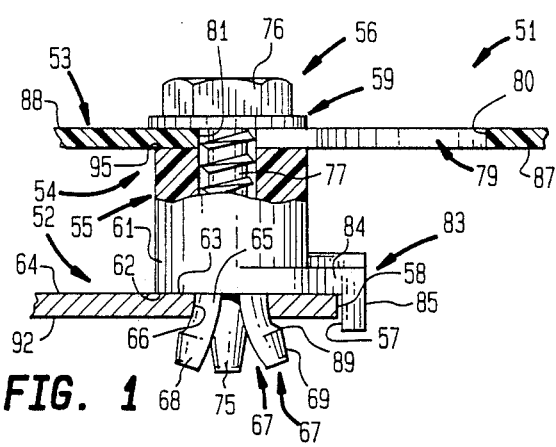
FIG. 1
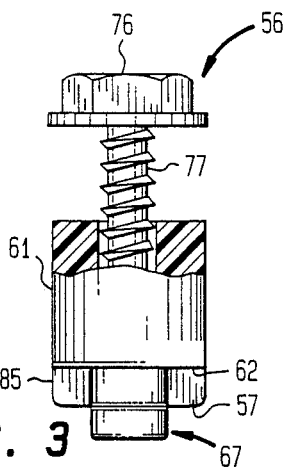
FIG. 3
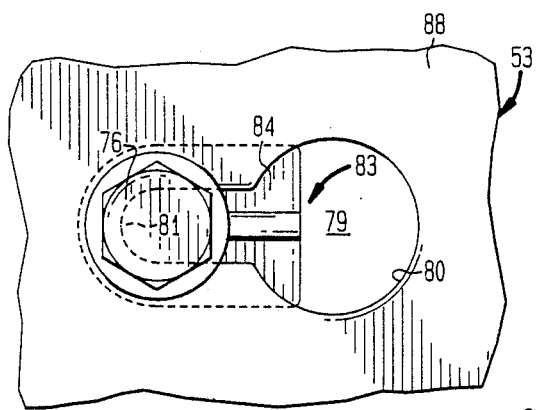
FIG. 2
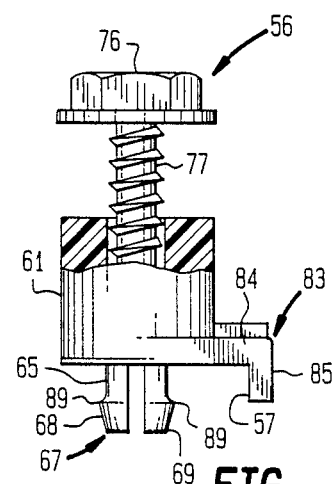
FIG. 4
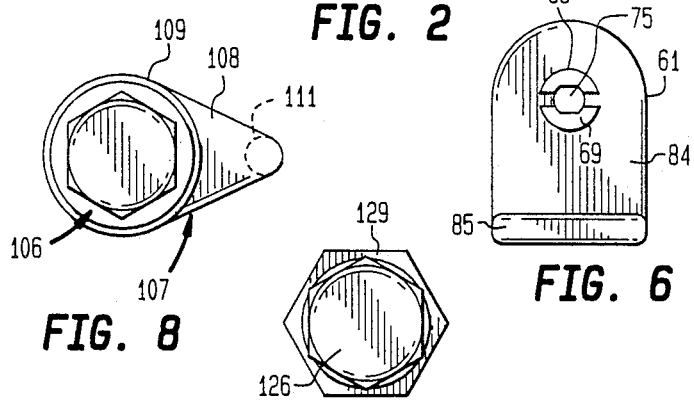
FIG. 8   FIG. 6   FIG. 5
FIG. 10
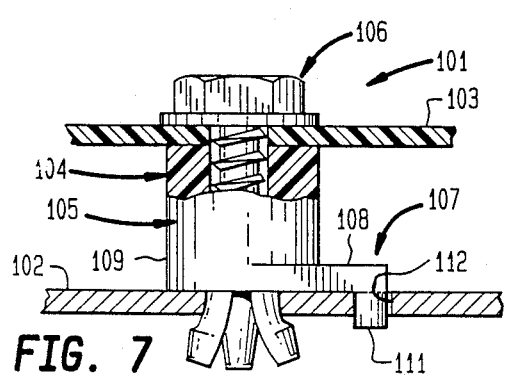
FIG. 7
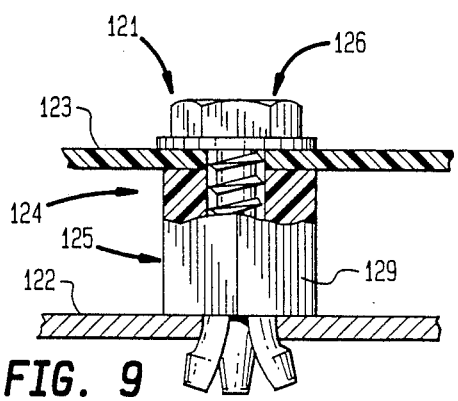
FIG. 9

SPACER FOR CIRCUIT BOARDS AND CIRCUIT BOARD ASSEMBLY INCLUDING SAME

BACKGROUND OF THE INVENTION

This invention relates generally to electrical circuit board apparatus and, more particularly, to electrical circuit board apparatus utilizing improved spacer devices for separating and supporting a printed circuit board from a chassis.

Printed circuit boards are used extensively in various types of electrical equipment. Typically, standoff elements are used to support and provide spacing for circuit boards. Standoffs are used, for example, to separate, support and electrically insulate a printed circuit board from either a metal chassis or other printed circuit boards. Prior standoffs have suffered from a number of disadvantages including labor intensive assembly requirements, high piece part costs, lack of functional flexibility, etc. Examples of electrical circuit boards employing standoff elements are disclosed in U.S. Pat. Nos. 3,777,052 and 3,688,635.

The object of this invention, therefore, is to provide an improved standoff device for use with electrical equipment utilizing printed circuit boards.

SUMMARY OF THE INVENTION

The invention is a circuit board assembly including a first board; a second board substantially parallel to and separated from the first board; a spacer comprising a body portion disposed between the boards and having a shoulder portion engaging on one side of the first board a surface area directly adjacent to an opening through the first board, a stem portion extending through the opening, and a latch portion engaging another side of the first board opposite to the one side thereof; an actuator retaining the latch portion in a position providing the engagement with the another side of the first board; and a fastener engaging opposite sides of the second board and thereby preventing any substantial movement thereof relative to the first board. After activation by the actuator, the spacer together with the fastener securely retain the first and second boards in a predetermined spaced apart relationship.

According to one feature of the invention, a stop engages an edge on one of the boards, the stop being an appendage of the body portion and comprising a first leg portion extending transversely from the body portion and a second leg portion extending from an outer end of the first leg portion in the direction of separation of the first and second boards. The second leg portion engages and positions the edge of the one board relative to the spacer.

According to other features of the invention, the spacer is an open-ended sleeve forming the body, stem and latch portions; the actuator is a pin inserted into the sleeve and engaging inner surface portions of the latch portion so as to produce radial expansion thereof; the latch portion is a bifurcated projection of the stem portion and with radially expandable bifurcations spaced apart a distance less than inner diameters of the body and stem portions; the actuator is a pin having an outer diameter greater than the distance between the bifurcations and less than the diameters of the body and stem portions such that the pin engages the bifurcations producing radial expansion thereof into engagement with the opposite side of the first board.

In one embodiment of the invention, the spacer is plastic; the stop engages the first board; the shoulder portion comprises one end of the body portion and an opposite end thereof forms a first portion of the fastener engaging one side of the second board facing the first board; and the pin is metal and comprises a head portion forming a second portion of the fastener and engaging another side of the second board opposite to the one side thereof, a tip portion engaging the latch portion, and a threaded shank portion straddled by the tip and head portions. By turning the threaded shank portion into penetrating engagement with the body portion, a secure retention of the second board is obtained. In addition, the metal tip portion significantly improves the resistance of the plastic stem portion to shear damage in response to shock impact.

BRIEF DESCRIPTION OF THE DRAWINGS

These and other objects and features of the invention will become more apparent upon a perusal of the following description taken in conjunction with the accompanying drawings wherein:

FIG. 1 is a view partially in cross section of a circuit board assembly according to the invention;

FIG. 2 is a top view of the assembly shown in FIG. 1;

FIG. 3 is a front view of a circuit board support device embodiment used in the assembly shown in FIG. 1;

FIG. 4 is a side view of the support device embodiment illustrated in FIG. 3;

FIG. 5 is a top view of the support device embodiment illustrated in FIG. 3;

FIG. 6 is a bottom view of the support device embodiment illustrated in FIG. 3;

FIG. 7 is a view partially in cross section of another circuit board assembly according to the invention;

FIG. 8 is a top view of the support device used in FIG. 7;

FIG. 9 is a view partially in cross section of another circuit board assembly according to the invention; and FIG. 10 is a top view of the support device used in FIG. 9.

DESCRIPTION OF THE PREFERRED EMBODIMENTS

A circuit board assembly embodiment 51 according to the invention is illustrated in FIGS. 1-6. Included in the assembly 51 is a first board 52 separated from a second board 53 by a support device 54. One of the boards 52, 53 could consist of a metal chassis for electrical equipment while the other board could be a printed circuit board used in the equipment. Also, it will be understood that the first and second boards 52, 53 normally would be connected by a plurality of the devices 54 as required for desired separation and support.

The device 54 includes a spacer 55, an actuator 56, a stop member 57 engaging an edge 58 of the first board 52 and a fastener assembly 59 secured to the second board 53. Forming the spacer 55 is an open-ended sleeve having a body portion 61 disposed between the first and second boards 52, 53 and defining at one end a shoulder portion 62 engaging a surface area 63 on one side 64 of the first board 52; a stem portion 65 extending through an opening 66 in the first board 52 and surrounded by the surface area 63; and a bifurcated latch portion 67. Forming the latch portion 67 are radially expandable bifurcations 68, 69 initially spaced apart by a distance less than an inner diameter of the stem portion 65 and an inner diameter of the body portion 61. Preferably, the spacer 55 is a unitary body formed of a suitable moldable plastic.

The actuator 56 is a metal pin having a cylindrical tip portion 75 and a head portion 76 joined by a threaded shank portion 77 of larger diameter than the tip portion 75. Receiving internally the tip portion 75 of the actuator pin 56 are the body portion 61, the stem portion 65 and the latch portion 67 of the spacer sleeve 55. An outer diameter of the tip portion 75 of the actuator pin 56 is greater than the normal spacing between the bifurcations 68, 69 of the latch portion 67 but less than the inner diameters, respectively, of the stem portion 65 and the body portion 61. The shank portion 77 of the pin 56 projects through a key-hole slot 79 in the second board 53. Forming the slot 79 are a large portion 80 larger than the head portion 76 of the pin 56 and a small portion 81 smaller than the head portion 76.

An appendage 83 of the body portion 61 forms the stop member 57. A first leg 84 of the appendage 83 has one end fixed to the body portion 61 and extends transversely therefrom. Extending from an outer end of the first leg 84 in the direction of separation of the first and second boards 52, 53 is a second leg 85 that engages the edge 58 of the first board 52. An end 95 of the body portion 61 opposite to the shoulder portion 62 engages one side 87 of the second board 53 so as to form one part of the fastener assembly 59. Another part of the fastener assembly 59 is the head portion 76 of the actuator pin 56 that engages another side 88 of the second board 53 opposite to the one side 87 thereof.

During assembly of the circuit board embodiment 51, the latch portion 67 and stem portion 65 of the space 58 are inserted through the opening 66 in the first board 52. The stem and latch portions are retained in position by nipples 89 on the bifurcations that engage another side 92 of the first board 52 opposite to the one side 64 thereof. During movement through the opening 66, forcible engagement between the surface of the opening 66 and the nipples 89 causes temporary contraction of the latch portion 67. Next, the head portion 76 of the pin 56 is inserted through the large portion 80 of the hole 79 in the second board 53 which then is moved transversely to align the head portion 76 with the small portion 81 of the hole 79 as shown in FIG 1. The shank portion 77 of the actuator pin 56 then is screwed into the body portion 61 of the sleeve 55 until the head portion 76 of the pin 75 engages the side 88 of the second board 53. During this relative movement between the pin 56 and the spacer 55, rotation thereof by the applied torque is prevented by engagement of the stop 57 with the edge 58, and the relatively small diameter tip portion 75 of the pin 56 passes freely through the body portion 61 and the stem portion 65. However, upon entering into the latch portion 67, the outer diameter of the tip portion 75 engages and radially expands the bifurcations 68, 69 into engagement with another side 92 of the first board 52 opposite to the one side 64 thereof. Accordingly, the spacer sleeve 55 becomes securely fixed to the first board 52. In addition, the second board 53 is securely retained between the head portion 76 of the pin 56 and another end 95 of the body portion 61 opposite to the shoulder portion 62 which typically engage, respectively, the sides 88 and 87 of the board 53. The mechanical strength provided by the metal tip portion 75 significantly reduces the possibility that the weaker plastic stem portion 65 will shear in response to shock impact.

Referring now to FIGS. 7 and 8, there is shown another circuit board assembly embodiment 101 of the invention. The embodiment 101 again includes a first board 102 separated from a second board 103 by a support device 104. Forming the support device 104 is a spacer sleeve 105, an actuator screw 106, and a stop member 107. The support device 104 is identical to the support device 54 in the embodiment 51 except for the replacement of the appendage 83 with the appendage 107. Forming the modified appendage 107 is a first leg 108 extending transversely from a body portion 109 of the spacer sleeve 105 and a second leg 111 extending from an outer end of the first leg 108 in the direction of separation of the first and second boards 102, 103. The second leg 111 is a pin that engages an edge of the first board 102 defined by an aperture 112 therein.

Use of the support device 104 in the embodiment 101 is the same as that described above for the support device 54 of the embodiment 51. However, in this embodiment 101, rotation of the spacer sleeve 105 while turning the actuator screw 106 is prevented by engagement of the pin stop 111 with the edge of the first board 102 defined by the aperture 112.

Illustrated in FIGS. 9 and 10 is yet another circuit board assembly embodiment 121 of the invention. The embodiment 121 again includes a first board 122 separated from a second board 123 by a support device 124. Forming the support device 124 is a spacer sleeve 125 and an actuator screw 126. The support device 124 is identical to the support device 54 in the embodiment 51 except for elimination of the appendage 83 and the provision of hexagonal outer surface on a body portion 129.

Use of the support device 124 in the embodiment 121 is similar to that described above for the support device 54 of the embodiment 51. However, in this embodiment 121, rotation of the spacer sleeve 125 while turning the actuator screw 126 is prevented by a restraining wrench (not shown) engaged with the hexagonal outer surface on the body portion 129.

Obviously, many modifications and variations of the present invention are possible in light of the above teachings. It is to be understood, therefore, that the invention can be practiced otherwise than as specifically described.

What is claimed is:

1. A device for supporting and separating substantially parallel first and second boards and comprising:
an open-ended sleeve for maintaining a predetermined spacing between the boards, said sleeve comprising a body portion adapted for disposition between the boards and having one end adapted to engage on one side of the first board a surface area directly adjacent to an opening through the first board, an opposite end adapted to engage one side of the second board facing the first board, a stem portion adapted for insertion through the opening, and a latch portion including an expandable portion actuatable to engage another side of the first board opposite to the one side thereof;
an actuator pin adapted for insertion into said sleeve and to engage inner surface portions of said expandable portion so as to produce radial expansion thereof, said pin comprising a threaded shank portion for insertion through an opening in the second board into threaded engagement with said body portion and a head portion adapted to engage another side of the second board opposite to the one side thereof; and an appendage of said body portion comprising a first leg portion extending transversely from said body portion and a second leg portion extending from an outer end of said first leg portion in the direction of separation of the first and second boards and adapted to engage an edge of one of the first or second boards so as to prevent rotation of said body portion.

2. A circuit board apparatus comprising:

a first board;

a second board substantially parallel to and separated from said first board;

an open-ended sleeve comprising a body portion disposed between said boards and having one end engaging on one side of said first board a surface area directly adjacent to an opening through said first board and an opposite end engaging one side of the second board facing the first board, a stem portion extending through said opening, and an expandable latch portion engaging another side of said first board opposite to said one side thereof;

an actuator pin having a tip portion maintaining said latch portion in a position providing said engagement with said another side of said first board, a threaded shank portion extending through an opening in said second board and engaging said body portion, and a head portion engaging another side of said second board opposite to said one side thereof; and an appendage comprising a first leg portion extending transversely from said body portion, a second leg portion extending from an outer end of said first leg portion in the direction of separation of said first and second boards and engaging an edge on one of said boards so as to prevent rotation of said body portion.

3. An apparatus according to claim 2 wherein said open-ended sleeve is a plastic sleeve forming said body, stem and latch portions; and said actuator pin is a metal pin inserted into said sleeve and engaging inner surface portions of said latch portion so as to produce radial expansion thereof.

4. An apparatus according to claim 3 wherein said latch portion is a bifurcated projection of said stem portion and with bifurcations spaced apart a distance less than inner diameters of said body and stem portions, and said pin has an outer diameter greater than said distance and less than said inner diameters of said body and stem portions.

5. An apparatus according to claim 2 wherein said tip portion has a cylindrical surface of smaller diameter than the diameter of said threaded shank portion.

6. An apparatus according to claim 2 wherein said one board is said first board.

* * * * *